(12) United States Patent
Nebashi et al.

(10) Patent No.: US 7,306,742 B2
(45) Date of Patent: Dec. 11, 2007

(54) PATTERNING METHOD, PATTERNING APPARATUS, PATTERNING TEMPLATE, AND METHOD FOR MANUFACTURING THE PATTERNING TEMPLATE

(75) Inventors: Satoshi Nebashi, Cambridge (GB); Takao Nishikawa, Shiojiri (JP); Tatsuya Shimoda, Suwa-gun (JP)

(73) Assignee: Seiko Epson Corporation, Tokyo (JP)

( * ) Notice: Subject to any disclaimer, the term of this patent is extended or adjusted under 35 U.S.C. 154(b) by 268 days.

(21) Appl. No.: 10/424,790

(22) Filed: Apr. 29, 2003

(65) Prior Publication Data

US 2003/0198897 A1  Oct. 23, 2003

Related U.S. Application Data

(62) Division of application No. 09/317,998, filed on May 25, 1999, now Pat. No. 6,646,662.

(30) Foreign Application Priority Data

May 26, 1998 (JP) .................................. 10-144892

(51) Int. Cl.
*B44C 1/22* (2006.01)
*B41J 2/16* (2006.01)
*H01L 41/22* (2006.01)

(52) U.S. Cl. .................... 216/12; 216/27; 216/41; 216/49; 216/56; 29/25.35; 430/313; 430/314; 430/315; 430/316; 430/317; 430/320

(58) Field of Classification Search .............. 216/8–10, 216/27, 41, 49, 52, 56; 219/121.69, 121.71
See application file for complete search history.

(56) References Cited

U.S. PATENT DOCUMENTS

| 3,958,255 | A | * | 5/1976 | Chiou et al. ................. 347/47 |
| 4,021,276 | A | * | 5/1977 | Cho et al. ..................... 216/2 |
| 4,164,745 | A | | 8/1979 | Cielo et al. .................. 347/61 |
| 4,166,277 | A | | 8/1979 | Cielo et al. .................. 347/55 |

(Continued)

FOREIGN PATENT DOCUMENTS

EP  0 732 209 A2  9/1996

(Continued)

OTHER PUBLICATIONS

Kim, Enoch et al., "Micromolding in Capillaries: Applications in Materials Science", *J. Am. Chem. Soc.*, vol. 118, No. 24, 1996, pp. 5722-5731.

(Continued)

*Primary Examiner*—Anita Alanko
(74) *Attorney, Agent, or Firm*—Oliff & Berridge, PLC

(57) ABSTRACT

A template 1 is brought close to or in contact with a surface to be patterned 111 and patterns are formed with liquid 62 on the surface 111. This method comprises the steps of: bringing the template 1 close to or essentially in contact with the surface 111, supplying liquid 62 to a plurality of through holes 12 established in the pattern transfer region 10 of the template 1 for supplying the liquid 62, and separating the template 1 from the surface 111 after the liquid 62 is adhered to the surface 111 via the through holes 12.

3 Claims, 8 Drawing Sheets

U.S. PATENT DOCUMENTS

| | | | |
|---|---|---|---|
| 5,334,999 A * | 8/1994 | Kashiwazaki et al. | 347/65 |
| 5,381,166 A | 1/1995 | Lam et al. | 346/140.1 |
| 5,481,280 A | 1/1996 | Lam et al. | 346/140.1 |
| 5,639,508 A | 6/1997 | Okawa et al. | |
| 5,868,947 A * | 2/1999 | Sakaguchi et al. | 216/2 |
| 6,057,865 A | 5/2000 | Hawkins | 346/140.1 |
| 6,143,190 A * | 11/2000 | Yagi et al. | 216/27 |
| 6,790,377 B1 * | 9/2004 | Cohen | 216/94 |
| 2002/0104762 A1 * | 8/2002 | Stonas et al. | 205/118 |
| 2003/0013002 A1 * | 1/2003 | Jankowski et al. | 429/40 |
| 2003/0106487 A1 * | 6/2003 | Huang | 117/68 |

FOREIGN PATENT DOCUMENTS

| | | |
|---|---|---|
| JP | 07117144 | 5/1995 |
| WO | WO 97/33737 | 9/1997 |

OTHER PUBLICATIONS

Greschner, J. et al., "Process for Image Reversal", *IBM Technical Disclosure Bulletin*, vol. 25, No. 6, Nov. 1982, p. 2730.

Hu, Junmin et al., "Using soft lithography to fabricate GaAs/AlGaAs heterostructure field effect transistors", *Appl. Phys. Lett.*, vol. 71, No. 14, Oct. 6, 1997, pp. 2020-2022.

Pede, Danilo et al., "Microfabrication of conducting polymer devices by ink-jet stereolithography", *Materials Science & Engineering*, vol. C05, 1998, pp. 289-291.

Rogers, John et al., "Nonphotolithographic fabrication of organic transistors with micron feature sizes", *Appl. Phys. Lett.*, vol. 72, No. 21, May 25, 1998, pp. 2716-2718.

US 2,777,441, 01/1957, Geisler (withdrawn)

* cited by examiner

111 Patterned surface
110 Substrate

F I G. 7
A
B
C
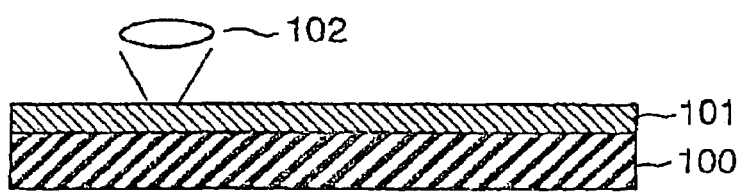
D
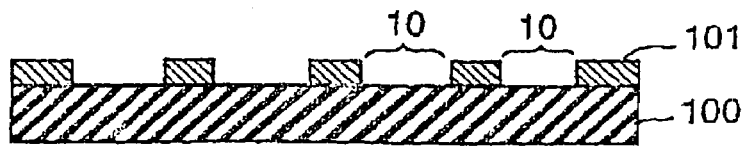
E
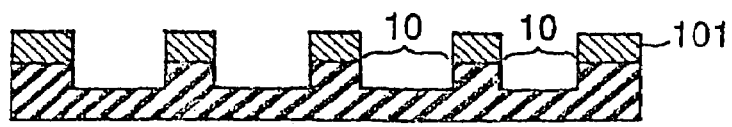
F
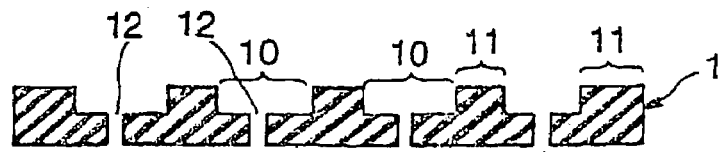

24: Ink tank aperture
3: Piezoelectric element
25: Reservoir
26: Supply aperture
22: Side wall
28: Nozzle
29: Nozzle panel
23: Oscillating panel
20: Pressure chamber panel
21: Pressure chamber

PATTERNING METHOD, PATTERNING APPARATUS, PATTERNING TEMPLATE, AND METHOD FOR MANUFACTURING THE PATTERNING TEMPLATE

BACKGROUND OF THE INVENTION

1. Field of the Invention

The present invention relates to a patterning technique for semiconductor integrated circuits or the like, and more particularly to a new patterning method using both a template and a inkjet system.

2. Description of the Related Art

Photolithography is a general method for manufacturing integrated circuits or the like on silicon substrates or glass substrates. To form patterns using photolithography, a thin coat of photosensitive material, called resist, is applied on a silicon wafer and then the integrated circuit pattern, prepared on a glass dry-template with photoengraving, is printed (transferred) with light. With the transferred resist pattern as a mask, the material beneath the resist is etched to form wiring patterns and elements. This photolithographic method requires processes such as resist application, exposure, and development, making it impossible to prepare fine patterns outside of a semiconductor plant or the like having facilities such as large scale equipment, power distribution facilities, and exhaust facilities. For this reason, other methods in a smaller scale for forming fine patterns have been researched.

For example, the method called MIMIC (micromolding in capillaries), for forming patterns using a mold, was disclosed in the Journal of the American Chemical Society 1996, No. 118, pp. 5722-5731. In this method, a template, whereon µm-order grooved structures are formed of polymer, is placed on the substrate and liquid is caused by capillarity to infiltrate from the grooved sides. The template is made of polydimethylsiloxane and the liquid is a polymer, solution of polymer, colloidal solution, or the like. After the reaction between the liquid and the substrate is complete, the template is removed to reveal patterns formed upon the substrate.

In the abovementioned MIMIC method, however, the distance to which the liquid can be supplied from the sides of the template is limited because the liquid is spread by capillarity. A consequent problem is that large patterns cannot be formed using wide templates.

SUMMARY OF THE INVENTION

The present invention was made in view of the foregoing problem and, to that end, provides a patterning method, with which it is possible to pattern variously sized areas inexpensively and without large scale facilities, a patterning apparatus with which such patterning is possible, and a patterning template used in such patterning.

The inventors found that they could form fine patterns, without limiting the template size, by using a template having through holes and supplying the liquid in the necessary quantities for patterning through the holds in the template.

The patterning method relating to the present invention is a patterning method for forming patterns with liquid on the surface to be patterned ("pattern surface") by placing a template close to or essentially in contact with the pattern surface. This patterning method comprises the steps of placing the template close to or essentially in contact with the pattern surface; supplying liquid to the through holes, a plurality of which are established in the pattern transfer region of the template in order for the supply of liquid; and removing the template from the pattern surface after the liquid passes through the through holes and adheres to the pattern surface.

In the abovementioned patterning method, the template may be a concave template, convex template, or flat template. The surface of the template may be flat or curved. The pattern surface may be curved or flat. In other words, the pattern surface may be made of a hard material such as a substrate or a flexible material such as film.

The liquid may be ink, or an organic material or inorganic material, so long as it has a viscosity allowing it to be supplied through the through holes. The liquid may also be a colloidal solution including fine grains. For example, various colloidal solutions, such as the following can be used: solution for forming black matrix comprising carbon powder dispersed in a solvent, solution for forming transparent electrodes comprising transparent electrode material dissolved in solvent, and solution for forming electrode patterns comprising metal fine grains dispersed in a solvent.

The pattern transfer region may have either uniform patterning or be prepared with a specific pattern. When photolithography is used in preparing the template, any pattern can be formed by adjusting the exposed region.

Each through hole in the template functions as a nozzle which supplies liquid to the pattern surface. The location and number of through holes in the template is not limited so long as it is possible to supply liquid to the pattern transfer region of the template. Through hole diameters and numbers of through holes, whereby it is possible to supply sufficient liquid in a short period of time, may be provided. It is preferable that the method for supplying liquid to the through holes be a method for applying pressure to the liquid, such as an inkjet system, because such method is fast and controllable. Also, natural liquid supply, so as to supply liquid to the through holes by capillarity, can be used. Capillarity and forced supply means such as an inkjet system may also be combined. Any material may be used as the template material so long as it has the physical strength to sustain patterning and is chemically inert with respect to the liquid. It is especially preferred that the template be constituted of a porous material or permeable material in order to naturally eliminate air after the liquid is supplied.

Below are concrete examples of the abovementioned patterning method relating to the present invention. In the abovementioned template, for example, the through holes may be disposed along the patterning region. In that case, the step for supplying the liquid is a step wherein liquid is supplied by pressurizing all the through holes established in the template.

Also, the through holes may be established uniformly in the abovementioned template. In that case, the step for supplying the liquid is a step wherein liquid is selectively supplied with an inkjet system to only the through holes disposed in the pattern transfer region from among all the through holes established in the template.

Furthermore, the abovementioned template may be constituted of a porous material. In the step where the template is separated from the pattern surface, the template is separated from the pattern surface after excess liquid supplied via the through holes is absorbed by the porous material.

The patterning apparatus relating to the present invention is a patterning apparatus for placing a template near or essentially in contact with a pattern surface and forming patterns with liquid on the pattern surface. The patterning apparatus is provided a template transport mechanism for placing the template near or essentially in contact with the pattern surface; a liquid storage mechanism for storing the liquid; a liquid supply mechanism for supplying the liquid from the liquid storage mechanism to the plurality of through holes established in the pattern transfer region of the template; and a control apparatus for controlling the transport of the template by the template transport mechanism and the supply of liquid by the liquid supply mechanism.

In the abovementioned patterning apparatus, the control apparatus causes the template to be placed near or essentially in contact with the pattern surface, liquid to be supplied via the through holes by the liquid supply mechanism, and the template to be removed from the pattern surface after the liquid adheres to the pattern surface.

The liquid storage mechanism is only required to store liquid by some method and, for example, comprises a tank for holding liquid and a pipe or the like through which liquid flows from the tank.

The template transport mechanism is a mechanism which can change the relative positions of the template and pattern surface; the template transport mechanism may transport the template, transport the substrate or the like having the pattern surface, or transport both.

The liquid supply mechanism may supply liquid by force using an inkjet system or the like; and may also have a constitution whereby the liquid is supplied naturally from the liquid reservoir using capillarity. In the case of an inkjet system, the liquid supply mechanism may have a constitution wherein liquid can be expelled from inkjet recording heads at the desired locations on the template. In this case, the liquid supply mechanism also includes a head transport structure constituted so as to vary the relative positions of the template and inkjet recording heads.

For example, the abovementioned template has the through holes disposed along the pattern transfer region and the liquid supply mechanism is provided a pressure chamber for supplying liquid to all the through holes in the template and a piezoelectric element which deforms at least one wall surface of the pressure chamber and changes the volume of the pressure chamber.

For example, the abovementioned template has through holes disposed uniformly therein; the liquid supply mechanism is provided inkjet recording heads constituted so as to expel the liquid and a head transport mechanism for transporting the heads to certain through holes established in the template. The control apparatus causes the heads to move and supply liquid to those through holes which are located in the pattern transfer region.

Furthermore, the abovementioned template is constituted of a porous material and the control apparatus removes the template from the pattern surface after the excess liquid supplied via the through holes is absorbed by the porous material.

The patterning template relating to the present invention is a patterning template for forming patterns by adhering liquid to a pattern surface. The pattern transfer region of the template is in the form of a concave template and a plurality of through holes is established in the pattern transfer region.

The patterning template relating to the present invention is a patterning template for forming patterns by adhering liquid to a pattern surface. The pattern transfer region of the template is in the form of a convex template and a plurality of through holes is established in the pattern transfer region.

Furthermore, the pattern transfer region of the template is in a form exhibiting an affinity for the liquid; the region other than the pattern transfer region ("the non-pattern transfer region") is in a form exhibiting a non-affinity for the liquid; and a plurality of through holes is established in the pattern transfer region.

Here, affinity and non-affinity are determined based on the properties of the liquid, which is used for the patterning. For example, if the liquid is hydrophilic, a hydrophilic composition exhibits affinity and a hydrophobic composition exhibits non-affinity. Oppositely, if the liquid is lipophilic, a hydrophilic composition exhibits non-affinity and a hydrophobic composition exhibits affinity. The liquid may be varied in different ways according to the industrial application.

For example, the abovementioned template is formed so that the pattern transfer region has the subject pattern. Also, the abovementioned template may be formed in a standard pattern wherein the pattern transfer region is uniformly arranged. The abovementioned template may be formed of porous material. Furthermore, the inner walls of the through holes formed in the abovementioned template may be formed so as to exhibit non-affinity for the liquid.

The method for manufacturing the patterning template relating to the present invention is a method for manufacturing a patterning template for forming patterns by adhering liquid to a pattern surface, comprising the steps of: forming a resist layer on the base; exposing portions of the resist layer according to a pattern; developing the exposed resist layer; etching the base with the developed resist as an anti-etching mask; coating the etched base with porous material; curing the porous material applied; separating the cured porous material from the base; and forming a plurality of through holes in the pattern transfer region of the separated porous material to form the template.

In the abovementioned method for manufacturing the patterning template, exposure may mean forming a mask in the resist layer and irradiating it with light or exposing the resist to the prescribed pattern using a laser beam pickup with positional selectivity. The resist layer may be positive type or negative type. The type of resist layer and exposure region are determined according to whether the template is a concave or convex template.

BRIEF DESCRIPTION OF THE DRAWINGS

FIG. 7 A-F are cross sectional views showing the steps in the method for manufacturing the template in the first embodiment of the present invention;

DESCRIPTION OF THE PREFERRED EMBODIMENTS

The preferred embodiments of the present invention are explained below with reference to the figures.

FIRST EMBODIMENT

The method for forming a black matrix (shaded pattern) such as is used in a color filter, or the like, for a liquid crystal panel using a concave template is explained as the first embodiment of the present invention.

Figure 1:
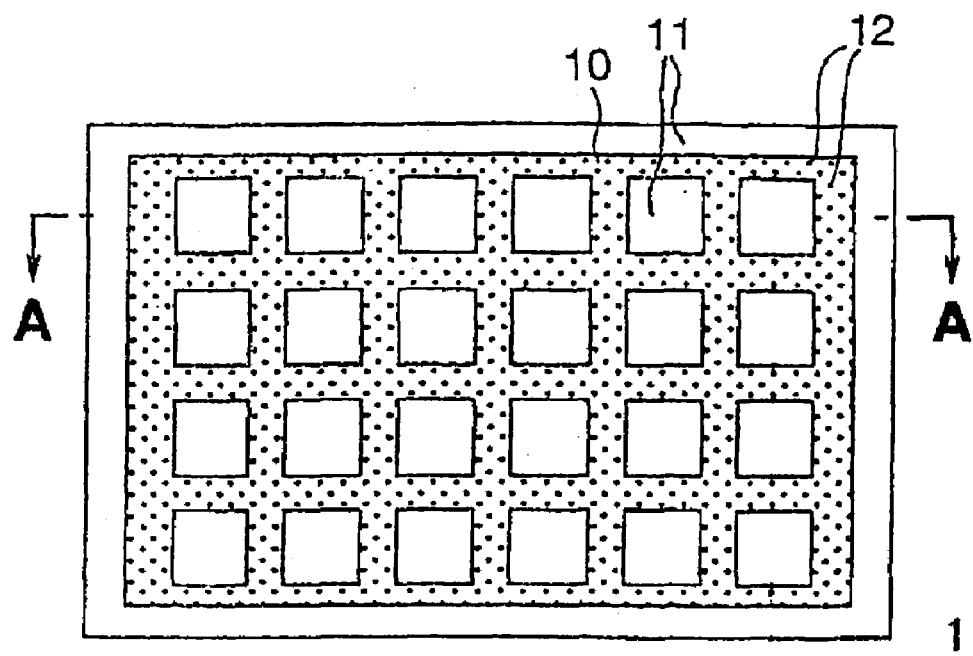
FIG. 1 is a plane view showing the structure of the template used in the first embodiment of the present invention.
Figure 2:
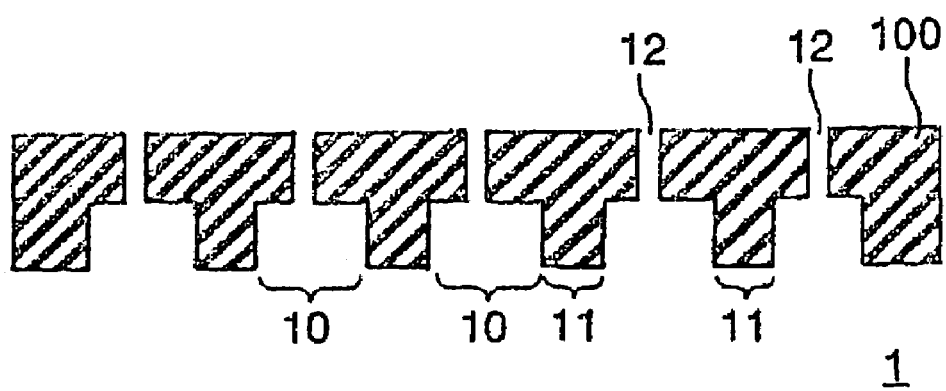
FIG. 2 is a cross sectional view taken at line A-A in FIG. 1 showing the structure of the template used in the first embodiment of the present invention.

FIG. 1 is a plane view of the pattern transfer surface of the template used in the present embodiment. FIG. 2 is a cross sectional view showing the structure of this template along line A-A (cut surface) in FIG. 1.

As shown in FIGS. 1 and 2, the template 1 of the present embodiment has a structure wherein the pattern transfer region 10 is formed as concave portions in the pattern transfer surface (bottom in FIG. 2) of the original template 100. A plurality of through holes 12, passing through to the back surface (top in FIG. 2) of the original template 100, is formed in the pattern transfer region 10. The inner walls of the through holes 12 are preferably finished or treated so as to exhibit non-affinity for the liquid. If treated for non-affinity, liquid is eliminated from within the through holes 12 when liquid is not being supplied and the drops of liquid are securely cut off. The region where concave areas are not formed, specifically the convex areas, comprise the non-pattern transfer region 11. The pattern transfer region 10 is formed according to the pattern of a black matrix formed in the color filter of a liquid crystal panel.

A porous material is preferably used as the material forming the template 1. When liquid is supplied from the through holes with the template 1 being placed essentially in contact with the surface to which the pattern is transferred, air in the recessed portions corresponding to the pattern transfer region 10 escapes into the porous material and this causes the liquid to fill into every portion of the pattern transfer region 10. Therefore, using a porous material prevents voids from remaining in the concave portions. Polydimethylsiloxane, for example, is used as the porous material.

The thickness of the pattern transfer region 10 of the template 1 is adjusted so that the volume of the recessed portions formed by the difference in level with the non-pattern transfer region 11 suffices for the amount of liquid necessary for patterning. The liquid supplied in the small-diameter through holes 12 undergoes an extreme reduction in volume due to the evaporation of much of the solvent component. Consequently, the thickness of the pattern transfer region 10 must be sufficient to contain the amount of liquid in consideration of this volume reduction. Meanwhile, the non-pattern transfer region 11 of the template 1 has a thickness such that the template is provided sufficient physical strength; this thickness is adjusted so as to prevent the increase in passage resistance caused by the increasing lengths of the through holes 12.

Figure 3:
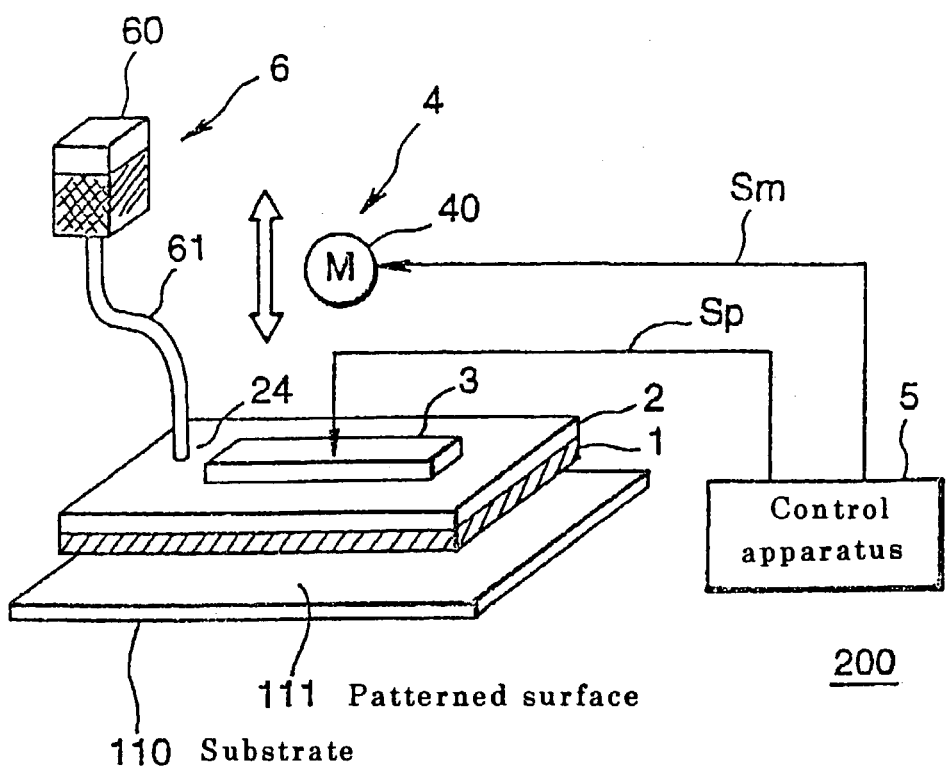
FIG. 3 is a diagram showing the entire structure of the patterning apparatus in the first embodiment of the present invention.

FIG. 3 shows the overall structure of the patterning apparatus in the present embodiment. As shown in FIG. 3, the patterning apparatus 200 in the present embodiment comprises a template 1 having the structure shown in FIGS. 1 and 2, a pressure chamber panel 2, a piezoelectric element 3, a template transport mechanism 4, control apparatus 5, and liquid storage mechanism 6.

The pressure chamber panel 2 is in contact with the template 1 and has a structure allowing it to supply liquid to the back surface of the template 1. Specifically, the actual structure is as shown in the cross sectional view in FIG. 4. The pressure chamber panel 2 includes side walls 22 in contact with the edge portions of the back surface of the template 1; an oscillating panel 23 is established on one surface thereof. The pressure chamber 21 is formed by the back surface of the template 1, side walls 22, and oscillating panel 23; the liquid 62 is stored therein via an ink tank aperture 24 established in the oscillating panel 23. The pressure chamber panel 2 has a fine structure manufactured by etching silicon, glass, or quartz, for example. The oscillating panel 23 is formed, for example, of heat oxide film. The piezoelectric element 3 is formed on the oscillating panel 23 at a position corresponding to the pressure chamber 21. The ink tank aperture 24 discussed above is established in the oscillating panel 23. The liquid to form the desired pattern is supplied to the pressure chamber 21 from the tank 60 via a pipe 61 by the liquid storage mechanism 6 discussed below. Moreover, a colloidal solution of carbon powder dissolved in solvent, for example, is used as the liquid in the present embodiment.

Figure 4:
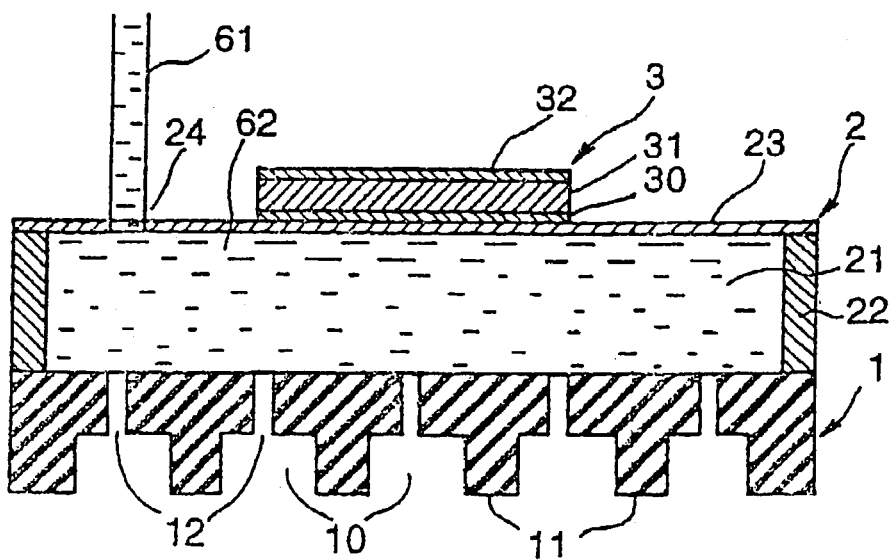
FIG. 4 is a cross sectional view showing the combined structure of the pressure chamber panel and template in the first embodiment of the present invention.

The piezoelectric element 3 comprises a piezoelectric thin film 31 held between a lower electrode 30 and an upper electrode 32, as shown in FIG. 4. The lower electrode 30 and upper electrode 32 are formed with a stable, conductive material such as platinum. The piezoelectric thin film 31 is formed of a material with an electromechanical transducing action and is constituted with a crystalline structure of a ferroelectric material such as PZT (lead zirconate titanate). The piezoelectric element 3 is constituted so as to effect changes in volume corresponding to the discharge signal Sp supplied from the control apparatus 5.

Moreover, the abovementioned pressure chamber panel is constituted so that volume changes are effected with the piezoelectric element, the volume within the pressure chamber is changed, and liquid is expelled. The pressure chamber panel may also have a structure wherein the liquid is heated with a heating element and drops thereof are expelled due to its expansion. Also, as discussed above, the liquid 62 within the pressure chamber 21 may be naturally guided into the pattern transfer region 10 by capillarity due to the material forming the pressure chamber panel 2 and template 1 and the form and dimensions of the through holes 12.

Moreover, one each of the pressure chamber 21 and piezoelectric element 3 is shown in each figure in order for simplicity in this explanation, but a plurality of pressure chambers may be established in prescribed regions and a plurality of piezoelectric elements 3 may be established corresponding thereto.

The template transport mechanism 4 comprises a mechanical structure with a motor 40 and other elements, not shown. The motor 40 is constituted so as to be driven according to a drive signal Sm from the control apparatus 5. The power of the motor 40 is constituted so as to be able to transport the template 1 and pressure chamber panel 2 upwards and downwards, in the figure. Moreover, it is sufficient that the template transport mechanism 4 be a constitution so as to change the positions of the template 1 and pressure chamber panel 2 relative to the substrate 110. For this reason, constitutions other than the abovementioned constitution may be used so that the substrate 110 moves relative to the template 1 and so forth, or both the template 1 and so forth and substrate 110 move.

The control apparatus 5 is provided the functions of a computer apparatus or sequencer and is constituted so that the patterning method of the present invention is carried out by the patterning apparatus. The apparatus outputs the drive signal Sm to the motor 40 of the template transport mechanism 4 and and is able to change the distance between the template and pattern surface 111 at the desired timing. This apparatus is constituted to supply a discharge signal Sp to the piezoelectric element 3, so that the liquid 62 is supplied to the template 1 from the pressure chamber panel 2 at the desired timing.

The liquid storage mechanism 6 comprises a tank 60 and pipe 61. The tank 60 holds the liquid for forming patterns; the pipe 61 is formed to supply the liquid stored in the tank 60 to the ink tank aperture 24 in the pressure chamber panel 2.

Patterning Method

Next, the patterning method using the abovementioned patterning apparatus 200 is explained with reference to FIGS. 4 and 5.

In the state as shown in FIG. 4 wherein the discharge signal Sp is not applied to the piezoelectric element 3, the liquid 62 fills the pressure chamber 21 of the pressure chamber panel 2. Due to the high surface tension of the liquid, the liquid does not flow into the through holes 12 in this state. The substrate 110 subject to patterning is positioned within a range in which the template 1 can be transported by the template transport mechanism 4.

Figure 5:
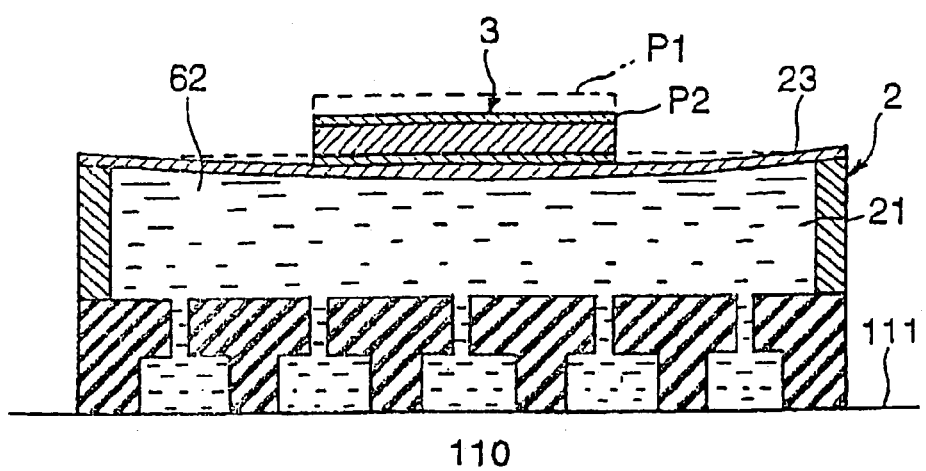
FIG. 5 is a cross sectional view showing the patterning method of the first embodiment of the present invention.

Next the control apparatus 5 transports the template 1 and pressure chamber panel 2 toward the substrate 110 and places the pattern transfer surface of the template 1 in contact with the pattern surface 111 of the substrate 110 as shown in FIG. 5.

Then the control apparatus 5 supplies the discharge signal Sp to the piezoelectric element 3. The application of voltage causes the volume of the piezoelectric element 3 to change, deforming the oscillating panel 23. As a result, the oscillating panel 23 deforms from the position P1 shown with the dotted line to the flexed position P2, as shown in FIG. 5. When the oscillating panel 23 deforms, the pressure on the liquid in the pressure chamber 21 increases and the liquid moves from the through holes 12 into the recessed portions of the pattern transfer region 10. When the liquid enters the recessed portions, a corresponding volume of air must escape. Although the recessed portions are surrounded on four sides by the template 1 and substrate 110, the template 1 is formed of porous material as discussed above. Thus, a volume of air corresponding to the liquid entering the recessed portions is expelled via the wall portions of the template 1. For this reason, the liquid can fill every part of the recessed portions of the pattern transfer region 10 without air remaining in the recessed portions.

Figure 6:
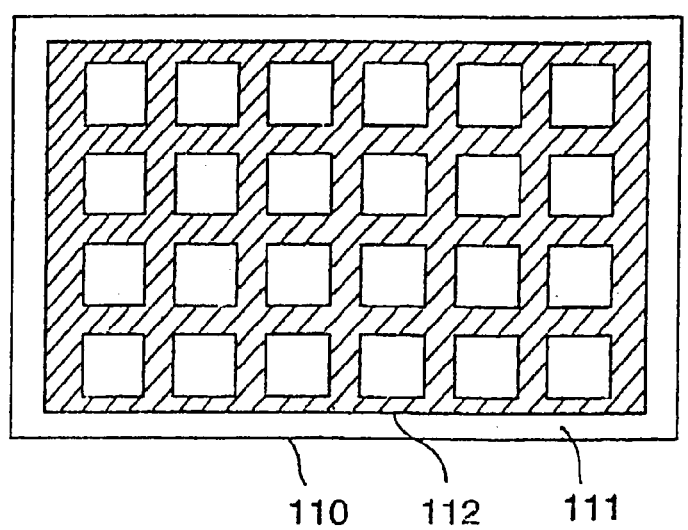
FIG. 6 is a plane view showing patterning transferred by the template in the first embodiment of the present invention.

When the liquid contacts the substrate 110, the control apparatus 5 supplies the drive signal Sm to the template transport mechanism 4 while providing the discharge signal Sp to the piezoelectric element 3. The template 1 is lifted along with the pressure chamber panel 2 and an appropriate amount of liquid is transferred according to the form of the pattern transfer region 10 of the template 1. If heat treatment, chemical treatment, or the like is performed on the substrate 110 and the solvent component of the liquid transferred to the substrate 110 is evaporated, then the carbon grains in the liquid are fixed on the substrate 110. With these processes, a black matrix 112 is formed as shown in FIG. 6 and has the form of the pattern transfer region 10 shown in FIG. 1 transferred without alterations to the pattern surface 111 of the substrate 110.

In the case of a structure where the liquid 62 in the pressure chamber 21 is naturally guided by capillarity into the recessed portions of the pattern transfer region 10, the control apparatus 5 need only control the upwards and downwards movement of the template 1. In this constitution, the recessed portions in a state of being continually filled with the liquid 62; as a result, a pattern of liquid is left on the pattern surface 111 when the template 1 is placed in contact with the substrate 110 and then removed.

Method for Manufacturing the Template

Next, the method for manufacturing the template 1 is explained with reference to FIG. 7. FIGS. 7A-F are cross sectional views showing each manufacturing process.

Forming the Resist Layer (FIG. 7B)

The resist layer coating process is a process for forming a resist layer on the pattern transfer surface of the base template 100. First, the abovementioned porous material is molded and formed into the base template (FIG. 7A). Next a resist layer 101 is formed on one surface of the base template 100. The resist material may be positive or negative. With a negative resist, the exposed portions become insoluble in the developing solution and remain. With a positive resist, the unexposed portions become insoluble in the developing solution and remain. The resist is applied to a uniform thickness using methods such as a spinner method, spray method, or the like and forms the resist layer 101.

Exposure (FIG. 7C)

The exposure process exposes the resist layer 101 according to the type of the resist in the prescribed pattern. In other words, when using a positive resist as the material for the resist layer 101, the non-pattern transfer region 11 is irradiated with light 102. When using a negative resist, the pattern transfer region 10 is irradiated with light 102. A usual resist material, such as the novolak type or chemical amplifier type, is used as the resist material. An energy beam using a known light source such as a UV lamp or excimer laser is used as the light 102.

Developing (FIG. 7D)

The developing process develops the exposed resist layer and leaves only those portions of the resist layer corresponding to the non-pattern transfer region (region 11 in FIG. 2). A known developing solution, such as the following, is used in the developing process: alkali solutions such as tetramethyl ammonium hydroxide, potassium hydroxide, sodium hydroxide, or calcium hydroxide, or organic solvents such as xylene.

Etching (FIG. 7E)

In the etching process, the side of the base template material 100 having the developed resist layer 101 is etched with the resist layer as a mask to form the concave portions corresponding to the pattern transfer region 10. The etching method maybe wet anisotropic etching or anisotropic etching using an active gas, such as plane-parallel reactive ion etching. This etching preferably has high selectivity and selectively etches only the porous material. The etching depth is adjusted appropriately according to the amount of liquid necessary for the pattern, as discussed above. The etching depth may extend to a substantially central portion of the base height or thickness. After etching, the remaining resist layer 101, which was used as an etch-resistant mask, is removed with solvent or the like.

Through Hole Formation (FIG. 7F)

The process for forming through holes opens a plurality of through holes 12 in the etched base template 100. Methods such as laser finishing or punching are used to form the through holes 12. The number of through holes 124 is the number which can supply sufficient liquid to the recessed portions. In the case where the porous material of the template is a material which does not exhibit non-affinity for the liquid, it is preferable that the inner walls of the through holes 12 be finished or treated so as to exhibit non-affinity for the liquid. Methods of finishing the surface so as to exhibit non-affinity for the liquid are discussed below in section concerning other variations.

A template can be manufactured in the following manner by arranging the method shown in FIG. 7. Foremost, by using a flat plate constituted of a porous material or other materials as the base plate 100, a pattern having a concave and convex surface is formed on the base plate 100 by steps A through E. Subsequently, a porous material is applied on this etched base plate to form a layer constituted of a porous material, and the pattern of this base plate is transferred to such porous-material layer. Thereafter, the porous-material layer with the aforementioned pattern transferred thereon is removed from the base plate 100, and through holes are formed on the porous-material layer in a manner explained in FIG. 7F, whereby a patterning template (the removed porous-material layer) is obtained.

According to the first embodiment, the template has a structure with a concave form and has through holes passing through the concave portions; this is a template whereby a large pattern is formed as a unit. Therefore, patterning can be done inexpensively and without using large scale facilities. With this template, liquid can be supplied directly to the pattern transfer region from through holes on the back side of the template; patterns can therefore be formed over a broader area than is possible with the abovementioned MIMIC method. Consequently, this is an appropriate method for creating patterns such as black matrixes, transparent electrodes, regular electrodes, and so forth for large liquid crystal panels.

SECOND EMBODIMENT

Next, a method for using a convex template to form a black matrix (shaded pattern) used in a color filter, or the like, of a liquid crystal panel is explained as the second embodiment of the present invention.

Figure 8:
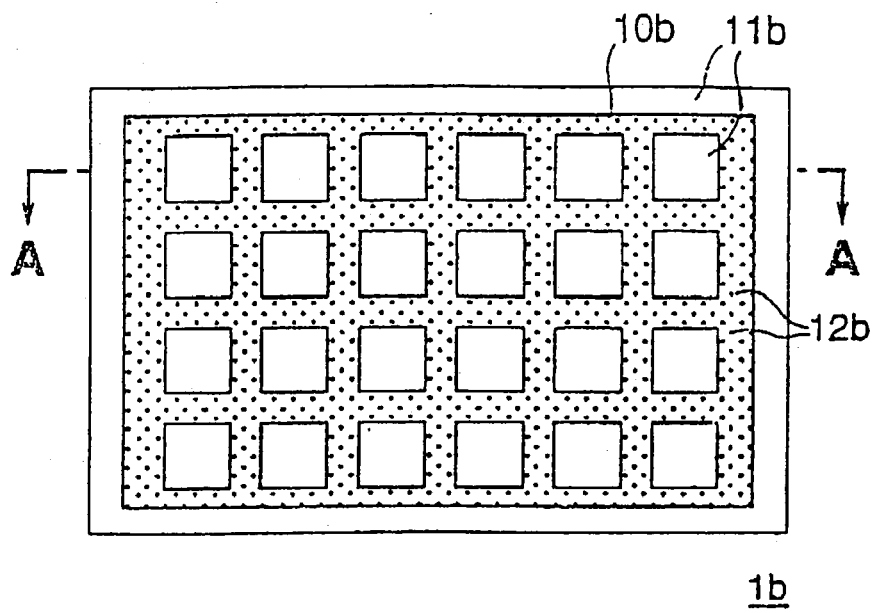
FIG. 8 is a plane view showing the structure of the template used in the second embodiment of the present invention.
Figure 9:
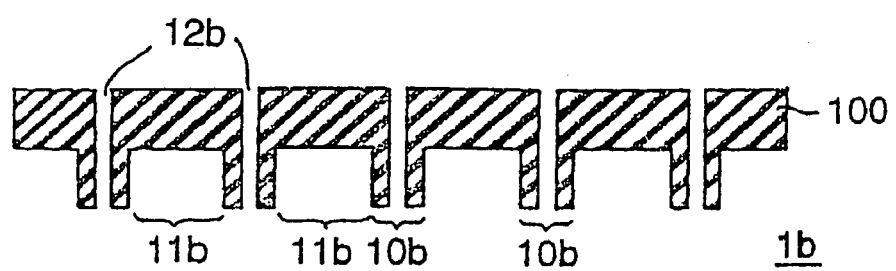
FIG. 9 is a cross sectional view taken at line A-A in FIG. 8 showing the structure of the template used in the second embodiment of the present invention.

FIG. 8 shows a plane view of the pattern transfer surface of the template used in the present embodiment. FIG. 9 is a cross sectional view showing the structure of the template along the line A-A (cut surface) in FIG. 8.

As shown in FIGS. 8 and 9, the template 1b in the present embodiment has the pattern transfer region 10b in a convex form on the pattern transfer surface of the base template 100. In other words, the planar structure of the pattern transfer surface in FIG. 8 is the same as in FIG. 1, but the pattern transfer region 10b corresponds to the convex portion of the template.

A plurality of through holes 12b passing to the back surface of the base template 100 are formed in the pattern transfer region 10b. The through holes 12b are preferably finished so as to have non-affinity for the liquid, as in the first embodiment above. The regions on the base template 100 where protrusions are not formed constitute the non-pattern transfer region 11b. The material and thickness of the template 1b can be the same as those in the first embodiment discussed above. The template 1b in the present embodiment is installed on a patterning apparatus 200, with the structure shown in FIG. 3 and explained in the abovementioned first embodiment, and used in conjunction with the pressure chamber panel as shown in FIGS. 3 and 4.

Patterning Method

Figure 10:
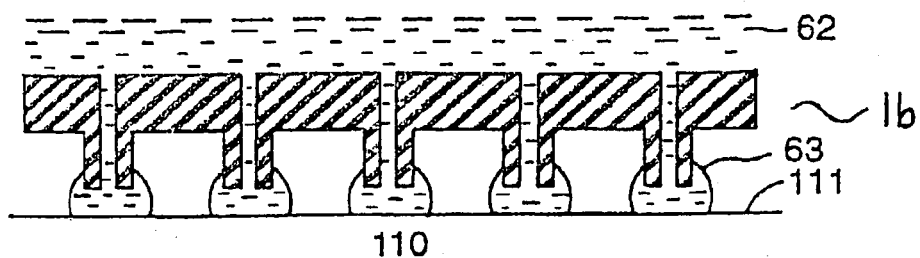
FIG. 10 is a cross sectional view for explaining the patterning method of the second embodiment of the present invention.

The patterning method in the present embodiment is essentially the same as that in the abovementioned first embodiment. As shown in FIG. 10, the template 1b, joined with the pressure chamber panel with the liquid 62 filling the pressure chamber (not shown), is moved in the direction of the substrate 110 until a slight gap is formed between the pattern transfer region 10b and pattern surface 111. Capillarity occurs in this gap and causes,the liquid 62 supplied via the through holes 12b to entirely fill the pattern transfer region 10b. Upon moving the template 1, the control apparatus 5 supplies the liquid 62 via the pressure chamber. The liquid 62 is supplied onto the substrate 110 from the through holes 12b and forms drops 63. After the drops 63 of liquid sufficiently attach to the surface of the substrate 110 and chemically react with the surface, the template 1b is separated from the substrate 110. A pattern is formed on the substrate 110 with this procedure. When carbon powder dissolved in solvent is used as the liquid and the pattern transfer region 10b has a lattice form as in FIG. 8, a black matrix for a color filter used in a liquid crystal panel is formed on the substrate 110 with the abovementioned procedure.

Moreover, the method for manufacturing the template 1b in the present embodiment may be based on the method for manufacturing the template in the abovementioned first embodiment. It is necessary to make appropriate adjustments such as reversing the resist material to positive or negative or reversing the exposed region and unexposed region.

With the second embodiment discussed above, the same effects as with the first embodiment can be attained even with the convex type of patterning template.

THIRD EMBODIMENT

Next, a patterning apparatus which can create the desired patterns using inkjet recording heads is explained as the third embodiment of the present invention.

Figure 11:
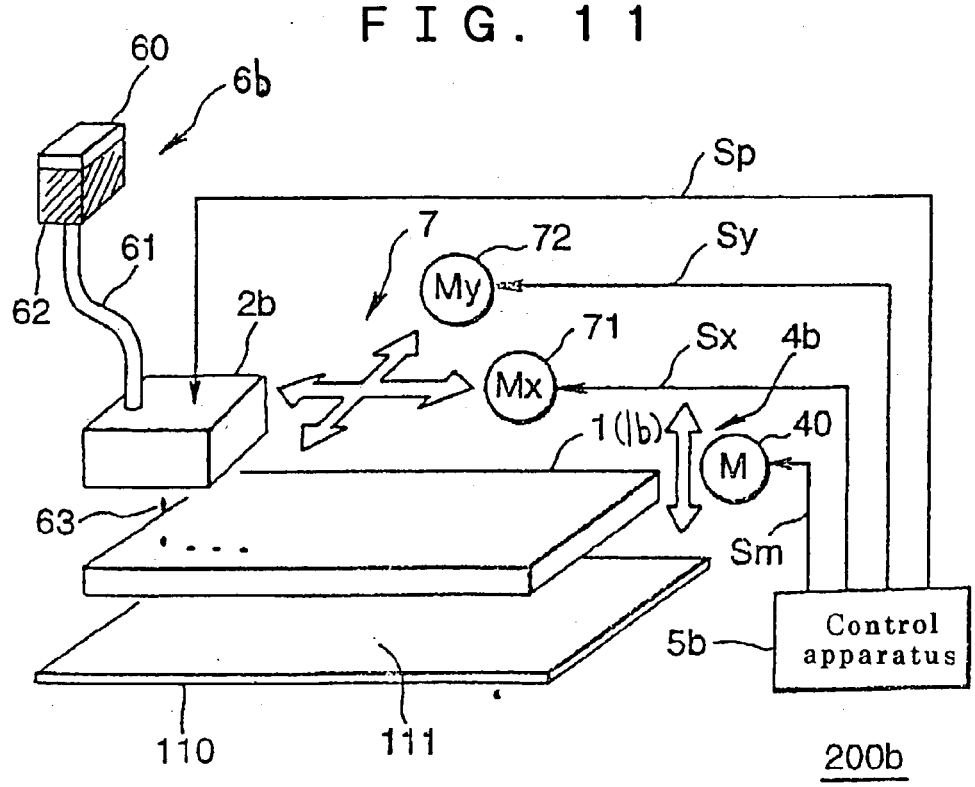
FIG. 11 is a diagram showing the entire structure of the patterning apparatus of the third embodiment of the present invention.

FIG. 11 shows the constitution of the patterning apparatus of the present embodiment. As shown in FIG. 11, the patterning apparatus 200b of the present embodiment comprises a template 1, inkjet recording heads 2b, a template transport mechanism 4b, control apparatus 5b, liquid storage mechanism 6b, and a head transport mechanism 7.

The template 1 (see FIGS. 1 and 2) used in the first embodiment can be used without any alterations as the template 1 in this embodiment. It is also possible to use the template 1*b* used in the second embodiment. Since the present embodiment in particular has a constitution wherein the desired pattern can be formed by transporting the inkjet recording heads, the template may have a lattice pattern or uniform pattern of dots at uniform intervals. The pattern transfer region 10 and non-pattern transfer region 11 (see FIG. 2), in the case of the template 1, and the pattern transfer region 10*b* and non-pattern transfer region 11*b* (see FIG. 10), in the case of the template 1*b*, are combined according to a certain convention. The liquid can be supplied to the desired pattern transfer region 10 or 10*b* by selecting whether to supply liquid from the through holes 12 or 12*b*.

Figure 12:
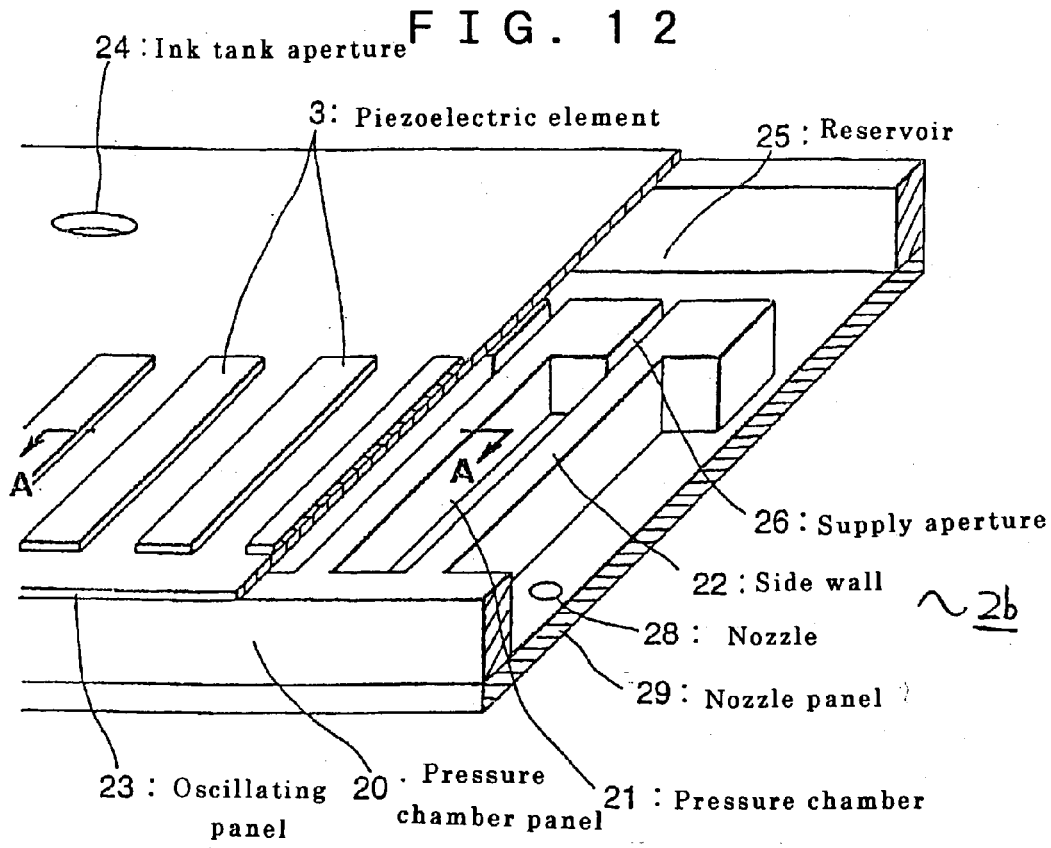
FIG. 12 is a partial cross sectional view showing the structure of the principal elements of the inkjet recording heads.

The inkjet recording heads 2*b* have the structure as shown in FIG. 12. An oscillating panel 23, with a piezoelectric element 3 thereon, is established on one surface of the pressure chamber panel 20. A nozzle panel 29, having nozzles 28 thereon, is laminated on the other surface of the pressure chamber panel 20. A pressure chamber (cavity) 21, reservoir 25, supply aperture 26, and so forth are formed on the pressure chamber panel 20 by etching silicon, glass, or quartz, for example. The pressure chamber 21 is partitioned with side walls 22. The oscillating panel 23 and piezoelectric element 3 have the same structure as used in the pressure chamber panel 2 in the abovementioned first embodiment. The nozzles 28 established in the nozzle panel 29 are established at positions corresponding to the pressure chamber 21. With the abovementioned constitution, the inkjet recording heads 2*b* are structured so that each pressure chamber 21 is filled via supply apertures 26 with liquid 62, supplied from the liquid storage mechanism 6 and introduced to the reservoir 25 via the ink tank aperture 24. When voltage is applied to the piezoelectric element 3, the volume of the corresponding pressure chamber 21 changes and drops 63 of liquid are discharged from the nozzle 28 corresponding to that pressure chamber.

Moreover, the abovementioned pressure chamber panel is constituted so that its volume is changed by the piezoelectric element 3 and liquid is discharged. It may also be constituted so that the liquid is heated by a heating element and drops are discharged due to the thermal expansion thereof.

The template transport mechanism 4*b* is provided the same type of structure as the template transport mechanism 4 (see FIG. 3) used in the abovementioned first embodiment. In the present embodiment, however, the template transport mechanism is constituted so that only the template 1 can be moved. This is because the inkjet recording heads 2*b* are transported independently from the template 1 by the head transport mechanism 7.

The liquid storage mechanism 6*b* comprises a tank 60 and pipe 61. The tank 60 holds the liquid relating to the present invention; the pipe 61 supplies the liquid stored in the tank 60 to the ink tank aperture 24 of the inkjet recording heads 2*b*.

The head transport mechanism 7 comprises motors 71 and 72 and other mechanical structures, not shown. The motor 71 is constituted to transport the inkjet recording heads 2*b* in the direction of the X axis according to the signal Sx from the control apparatus 5*b* to move in the direction of the X axis. The motor 72 is constituted to transport the inkjet recording heads 2*b* in the direction of the Y axis according to the signal Sy from the control apparatus 5*b* to move in the direction of the Y axis. Moreover, the template transport mechanism 7 may be provided a constitution so as to change the position of the inkjet recording heads 2*b* relative to the template 1. For this reason, other acceptable structures include the template 1 and substrate 110 moving in relation to the inkjet recording heads 2*b*, or the inkjet recording heads 2*b*, template 1, and substrate 110 all moving.

The control apparatus 5*b* is provided the functions of a computer apparatus or sequencer and is constituted so that the patterning method of the present invention is carried out by the patterning apparatus. The apparatus outputs the drive signal Sm to the template transport mechanism 4*b* and is able to change the distance between the template and pattern surface 111 at the desired timing. This apparatus is constituted to supply a discharge signal Sp to the piezoelectric element 3, so that drops 63 of liquid are supplied to the template 1 from inkjet recording heads 2*b* at the desired timing. Furthermore, the head transport mechanism 7 is provided a constitution so as to be able to transport the inkjet recording heads 2*b* to a desired position relative to the template 1 when supplied the X axis driving signal Sx and Y axis driving signal Sy.

Patterning Method

The patterning method using the abovementioned patterning apparatus 200*b* and the template 1 with the structure shown in FIGS. 1 and 2, or the template 1*b* with the structure shown in FIGS. 8 and 9, as the template is explained next. The control apparatus 5*b* transports the template 1 (1*b*) toward the substrate 110 and places the pattern transfer surface of the template 1 (1*b*) in contact with the pattern surface 111 of the substrate 110. Moreover, when the relief template 1*b* from the second embodiment is used, these are brought close together with a slight gap left therebetween.

Figure 13:
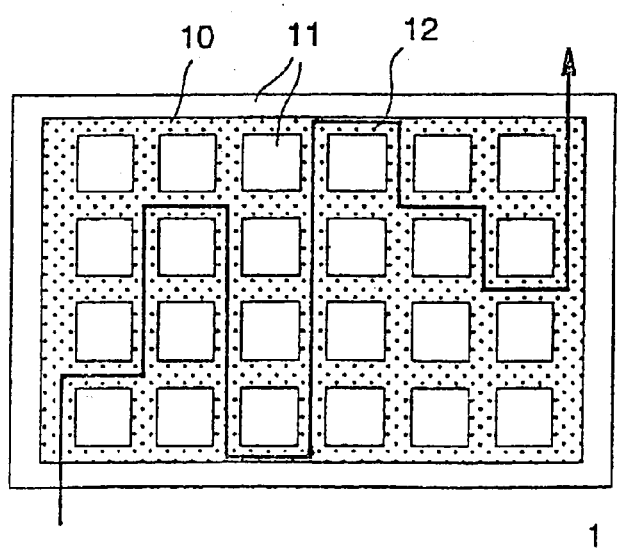
FIG. 13 is a diagram to explain the transport path of the inkjet recording heads.
Figure 14:
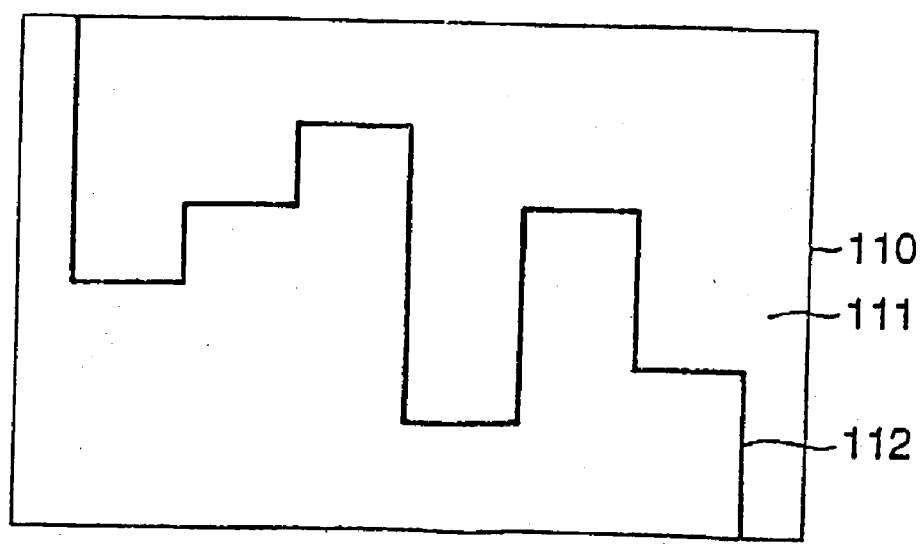
FIG. 14 is a plane diagram showing the patterning on the substrate formed with the patterning method of the third embodiment of the present invention.

The control apparatus 5*b* then supplies the X axis driving signal Sx and Y axis driving signal Sy to the head transport mechanism 7. The inkjet recording heads 2*b* is moved according to the driving signals over the template in the patterning route, established in advance, as shown with the arrow in FIG. 13. While transporting the inkjet recording heads 2*b*, the control apparatus 5*b* supplies the discharge signal Sp to the inkjet recording heads 2*b* at the positions where the through holes 12 (12*b*) are established on the pattern transfer region 10 (10*b*). Drops 63 of liquid are discharged from the inkjet recording heads 2*b* into the through holes 12 (12*b*) on the patterning route of the template 1 (1*b*). Because of the effects of capillarity in the through holes 12 (12*b*) impacted by the drops 63 of liquid, the liquid 62 moves through the through holes 12 (12*b*) and reaches the pattern transfer surface of the template 1 (1*b*). When using the template 1 from the first embodiment, the pattern transfer surface of the template 1 has an intaglio form and the transfer surface is placed essentially in contact with the pattern surface of the substrate 110. When using the template 1*b* from the second embodiment, the pattern transfer surface of the template 1*b* has a relief form and the transfer surface is placed near the pattern surface 111 of the substrate 110 with a small gap therebetween. The liquid 62 adheres on the substrate 110 in the pattern according to the transport route of the inkjet recording heads 2*b*. If this substrate 110 undergoes post-processing such as heat treatment, the pattern 112 of liquid can be formed on the pattern surface 111 of the substrate 110 as shown in FIG. 14.

As discussed above, the present embodiment has a constitution whereby the template and inkjet recording heads can be moved relative to each other. Therefore any pattern can be formed without the template being formed according to a specific pattern. In particular, the application of this technology can provide a moderately priced, household printer-sized manufacturing apparatus which can form any pattern because of the mass production of inkjet recording heads, which are small and inexpensive.

Other Variations

The present invention may also be applied to variations which are different from the abovementioned embodiments. For example, the form of the pattern transfer region established on the template disclosed in the abovementioned embodiments is merely an example; various changes not noted in the embodiments may be made. Identical patterns, as in FIG. 1 and so forth, may be established uniformly and regularly. However, it is also acceptable to form the pattern transfer region on the template according to a pattern to be established on the substrate. This type of structure makes it possible to form complex patterns as a unit.

Aspects of the template other than patterning may be modified in ways not noted in the abovementioned embodiments. In the abovementioned embodiments, for example, the patterning template was an concave template or a convex template, but it may also be a flat template.

When the patterning template is a flat template, the pattern transfer region of the template undergoes surface treatment so as to be an affinity region with affinity for the liquid and the non-pattern transfer region undergoes surface treatment so as to be a non-affinity region without affinity for the liquid. Provision of affinity or non-affinity to the surface of the template can be realized by selecting a method appropriate for the material used for the template.

For example, it is possible to use a method of forming self-assembling monomolecular films of sulfur compounds. In this method, a metal layer of gold or the like is established on the surface of the template; the template is soaked in a solution including sulfur compounds and self-assembling monomolecular films are formed. It is possible to provide affinity or non-affinity for the liquid depending on the composition of the sulfur compounds. Consider the template 1 with the sectional structure shown in FIG. 2 as an example. When the template 1 itself is made of a porous material exhibiting non-affinity for the liquid, a gold layer is established thereon and the gold in the region corresponding to the non-pattern transfer region 11 is evaporated and removed with a laser beam or the like. Soaking the template in sulfur compounds afterwards causes sulfur compounds exhibiting affinity for the liquid to self-assemble thereon. The region where the self-assembled film of sulfur compounds forms becomes the pattern transfer region 10; the region where the self-assembled film does not form becomes the non-pattern transfer region 11.

The same type of flat template can be produced by selectively adhering organic material such as paraffin on the template. Consider the template 1 with the sectional structure shown in FIG. 2 as an example. First, the template is manufactured of porous material exhibiting affinity for the liquid. The template is then coated with paraffin and the paraffin is masked in the form of the pattern transfer region 10. The paraffin is evaporated with the energy from a laser beam; the region from which the paraffin was removed becomes the pattern transfer region 10 and the region where paraffin remains becomes the non-pattern transfer region 11.

The same type of flat template can be manufactured with selective plasma treatment. The region irradiated with plasma has a large number of unreacted radicals and a crosslinked layer in the surface layer of the template material. This is exposed to the air or to an oxygen atmosphere and the unreacted radicals are oxidized to form carbonyl radicals and hydroxyl radicals. Because they are polarized, these radicals have affinity. Meanwhile most glass or plastic has non-affinity. Consequently, regions with affinity and regions with non-affinity can be produced with partial plasma treatment. Because the liquid is classified as to whether it has affinity for water (hydrophilicity), it is possible to produce a flat template relating to the present invention with the abovementioned method by further selecting the material of which the liquid is made. Furthermore, it is possible to manufacture a flat template wherein the regions exhibiting affinity for the liquid are mixed with the regions exhibiting non-affinity by using a method of providing an electric charge to the template surface.

Also, it is possible to attain a template used in the present invention by forming films exhibiting non-affinity (affinity) on a template showing affinity (non-affinity). This may be accomplished with various types of printing methods.

According to the present invention, patterning can be carried out inexpensively and without large scale facilities by using a patterning method which is provided a process for forming patterns using a template wherein through holes are established. In particular, the necessary quantity of liquid can be supplied regardless of the size of the template because it is possible to supply liquid directly from through holes to the pattern transfer region. Furthermore, since the template can be used as a master any number of times, the low depreciation costs can reduce the manufacturing costs of patterning.

According to the present invention, patterning can be carried out inexpensively and without large scale facilities by using a patterning apparatus which is provided a constitution wherein patterning is possible using a template wherein through holes are established. In particular, the necessary quantity of liquid can be supplied regardless of the size of the template because it is possible to supply liquid directly from through holes to the pattern transfer region.

According to the present invention, patterning can be carried out inexpensively and without large scale facilities by using a patterning template wherein through holes are established. In particular, the necessary quantity of liquid can be supplied regardless of the size of the template because it is possible to supply liquid directly from through holes to the pattern transfer region.

According to the present invention, patterning can be carried out inexpensively and without large scale facilities with the method for manufacturing a template wherein through holes are established. In particular, the necessary quantity of liquid can be supplied regardless of the size of the template because it is possible to supply liquid directly from through holes to the pattern transfer region.

By using a colloidal solution wherein carbon powder is dispersed as the liquid, for example, with the present invention, a black matrix for a color filter can be formed on the substrate by evaporating the solvent portion of the solution. By using a solution of dissolved transparent electrode material as the liquid, a transparent electrode film can be formed by heat treatment after patterning. By using a colloidal solution wherein metal particles are dispersed as the liquid, a conductive, patterned metal film can be formed by heat treatment after patterning.

The entire disclosure of Japanese Patent Application No. H10-144892 filed on May 26, 1998 including specification, claims, drawings and summary are incorporated herein by reference in its entirety.

What is claimed is:

1. A method for manufacturing a pattern template, the template being used to form patterns with a liquid adhered to a surface, the method comprising the steps of:

forming a resist layer on a base constituted of a porous material;

exposing portions of said resist layer according to a pattern;

developing said exposed resist layer;

etching the base whereon said developed resist layer is established, with the resist layer as a mask, to form a portion corresponding to a pattern transfer region, wherein the etching is performed through less than an entire thickness of the base;

forming a plurality of through holes in the portion to form a template; and finishing the surface of the pattern transfer region so as to exhibit affinity for a liquid transmitted through the template.

2. A method for manufacturing a patterning template, the template being used to form patterns with a liquid adhered to a surface, the method comprising the steps of:

forming a resist layer on a base constituted of a porous material;

exposing portions of said resist layer according to a pattern;

developing said exposed resist layer;

etching the base whereon said developed resist layer is established, with the resist layer as a mask, to form a portion corresponding to a pattern transfer region, wherein the etching is performed through less than an entire thickness of the base;

forming a plurality of through holes in the portion to form a template; and finishing the surface of the non-pattern transfer region so as to exhibit non-affinity for a liquid transmitted through the template.

3. A method for manufacturing a patterning template, the template being used to form patterns with a liquid adhered to a surface, the method comprising the steps of:

forming a resist layer on a base constituted of a porous material;

exposing portions of said resist layer according to a pattern;

developing said exposed resist layer;

etching the base whereon said developed resist layer is established, with the resist layer as a mask, to form a portion corresponding to a pattern transfer region, wherein the etching is performed through less than an entire thickness of the base;

forming a plurality of through holes in the portion to form a template; and finishing the inner walls of the through holes so as to exhibit non-affinity for a liquid transmitted through the through holes of the template.

* * * * *